US009424943B2

(12) United States Patent
Watanabe et al.

(10) Patent No.: US 9,424,943 B2
(45) Date of Patent: Aug. 23, 2016

(54) DATA READING DEVICE AND SEMICONDUCTOR DEVICE

(71) Applicant: Seiko Instruments Inc., Chiba-shi, Chiba (JP)

(72) Inventors: Kotaro Watanabe, Chiba (JP); Makoto Mitani, Chiba (JP)

(73) Assignees: SEIKO INSTRUMENTS INC., Chiba (JP); SII SEMICONDUCTOR CORPORATION, Chiba (JP)

( * ) Notice: Subject to any disclaimer, the term of this patent is extended or adjusted under 35 U.S.C. 154(b) by 74 days.

(21) Appl. No.: 14/551,725

(22) Filed: Nov. 24, 2014

(65) Prior Publication Data

US 2015/0162091 A1    Jun. 11, 2015

(30) Foreign Application Priority Data

Dec. 9, 2013  (JP) ................................. 2013-254350

(51) Int. Cl.
*G11C 7/22* (2006.01)
*G11C 16/28* (2006.01)
*G11C 16/22* (2006.01)

(52) U.S. Cl.
CPC ............. *G11C 16/28* (2013.01); *G11C 16/225* (2013.01)

(58) Field of Classification Search
CPC ........................................................ G11C 7/22
USPC ........................................................ 365/185.2
See application file for complete search history.

(56) References Cited

U.S. PATENT DOCUMENTS

| 5,289,414 | A  | * | 2/1994 | Hatsuda | G11C 8/00 327/51 |
| 6,385,110 | B1 | * | 5/2002 | Deguchi | G11C 11/5621 365/185.03 |
| 2004/0062089 | A1 | * | 4/2004 | Sumita | G11C 8/16 365/200 |
| 2005/0213363 | A1 | * | 9/2005 | Oga | G11C 29/02 365/145 |
| 2008/0266928 | A1 | * | 10/2008 | Shinozaki et al. | G11C 7/22 365/72 |
| 2010/0208531 | A1 |   | 8/2010 | Watanabe | |
| 2013/0258760 | A1 | * | 10/2013 | Hold | G11C 11/412 365/154 |

FOREIGN PATENT DOCUMENTS

JP            2010-192039 A        9/2010

* cited by examiner

*Primary Examiner* — Min Huang
(74) *Attorney, Agent, or Firm* — Brinks Gilson & Lione (57) ABSTRACT

The present invention provides a data reading device capable of preventing erroneous writing during an operation of reading data from a non-volatile memory element. The data reading device includes a dummy reading circuit provided with a non-volatile memory element, the writing voltage of which is lower than that of a non-volatile memory element of a data reading circuit, and a state detection circuit that detects a written state of the non-volatile memory element of the dummy reading circuit. Upon detection of erroneous writing to the non-volatile memory element of the dummy reading circuit during a data reading operation, the data reading operation is immediately terminated.

5 Claims, 7 Drawing Sheets

DATA READING DEVICE AND SEMICONDUCTOR DEVICE

RELATED APPLICATIONS

This application claims priority under 35 U.S.C. §119 to Japanese Patent Application No. 2013-254350 filed on Dec. 9, 2013, the entire content of which is hereby incorporated by reference.

BACKGROUND OF THE INVENTION

1. Field of the Invention

The present invention relates to a data reading device that reads out data from a non-volatile memory element in a semiconductor device.

2. Background Art

Figure 7:
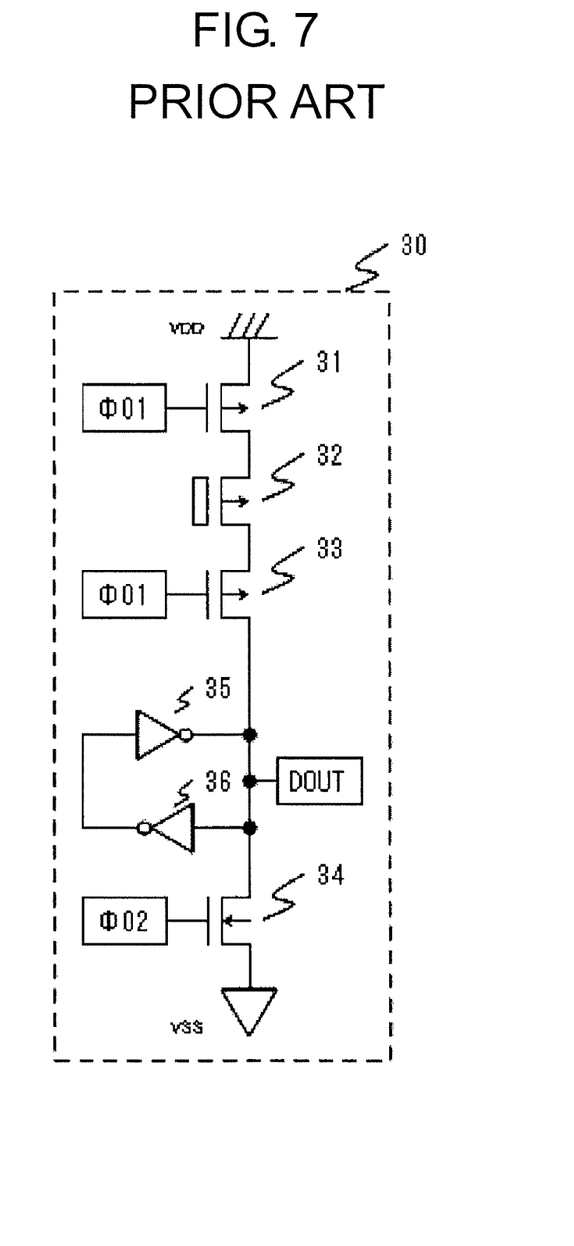
FIG. 7 is a circuit diagram illustrating a conventional data reading device.

FIG. 7 is a circuit diagram of a data reading device that reads out data from a non-volatile memory element.

A data reading circuit 30 includes a PMOS transistor 31, a non-volatile memory element 32, a PMOS transistor 33, an NMOS transistor 34, and a latch circuit composed of inverter circuits 35 and 36.

The data reading circuit 30 reads out data from the non-volatile memory element 32 by performing an operation described below.

First, a signal Φ02 goes to a high level, causing the NMOS transistor 34 to turn on. The latch circuit composed of the inverter circuits 35 and 36 is reset, and an output terminal DOUT goes to a low level. Thereafter, the signal Φ02 goes to the low level and the NMOS transistor 34 turns off. Then, a signal Φ01 goes to the low level and the PMOS transistors 31 and 33 turn on.

In a depression state in which data has been written to the non-volatile memory element 32, the on-current of the non-volatile memory element 32 causes the latch circuit to be inverted to the high level, and the output terminal DOUT is retained at the high level.

On the other hand, in an enhancement state in which no data has been written to the non-volatile memory element 32, the output terminal DOUT is maintained at the low level (refer to, for example, Patent Document 1).

The potential state around the non-volatile memory element 32 remains the same at the time of reading data and at the time of writing data.

[Patent Document 1] Japanese Patent Application Laid-Open No. 2010-192039

In the data reading circuit 30, the potential state around the non-volatile memory element 32 remains the same at the time of reading data and at the time of writing data. Hence, there has been a danger that erroneous writing to the non-volatile memory element 32 occurs if a high voltage of static electricity or the like is applied to a supply terminal during a data reading operation.

SUMMARY OF THE INVENTION

The present invention has been devised to solve the problem described above, and it is an object of the invention to achieve a data reading device that minimizes the possibility of erroneous writing.

To this end, a data reading device in accordance with the present invention includes a dummy reading circuit provided with a non-volatile memory element, the writing voltage of which is lower than that of the non-volatile memory element of a data reading circuit, and a state detection circuit that detects a written state of the non-volatile memory element of the dummy reading circuit. The data reading device is adapted to immediately terminate a data reading operation upon detection of the occurrence of erroneous writing to the non-volatile memory element of the dummy reading circuit while data is being read out.

The data reading device in accordance with the present invention makes it possible to prevent erroneous writing of data to a non-volatile memory element even if a high voltage of static electricity or the like is applied while data is being read out.

DETAILED DESCRIPTION OF THE PREFERRED EMBODIMENTS

First Embodiment

Figure 1:
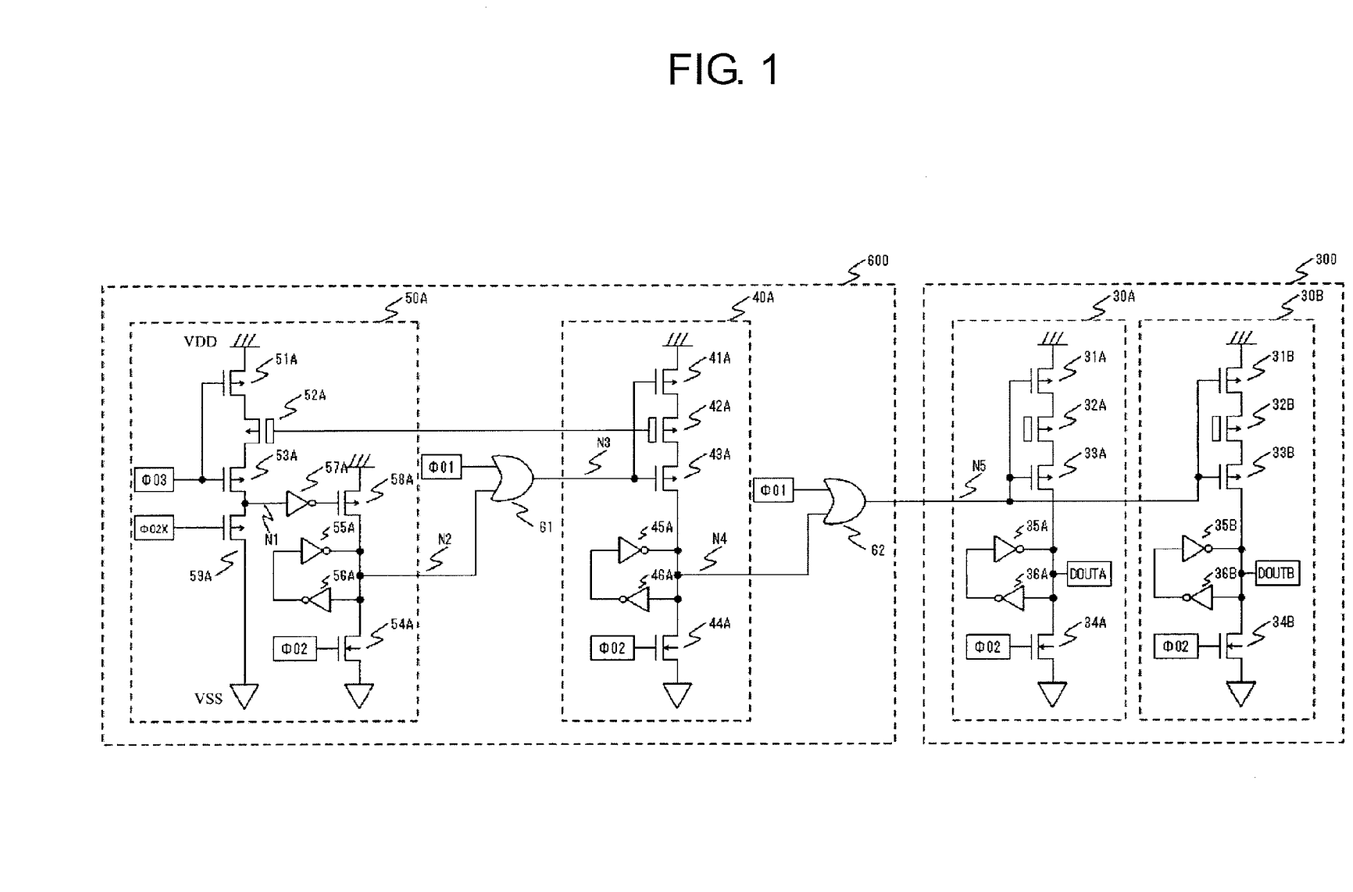
FIG. 1 is a circuit diagram illustrating a data reading device according to a first embodiment.

FIG. 1 is a circuit diagram illustrating a data reading device according to a first embodiment.

The data reading device has a data reading unit 300 and an erroneous writing prevention circuit 600. The data reading unit 300 is composed of data reading circuits 30A, 30B. The data reading circuit 30A includes PMOS transistors 31A, 33A, a non-volatile memory element 32A, an NMOS transistor 34A, and a latch circuit composed of inverter circuits 35A, 36A. The data reading circuit 30B includes PMOS transistors 31B, 33B, a non-volatile memory element 32B, an NMOS transistor 34B, and a latch circuit composed of inverter circuits 35B, 36B.

The erroneous writing prevention circuit 600 includes a dummy reading circuit 40A, a state detection circuit 50A, and OR circuits 61, 62.

The dummy reading circuit 40A, which has the same circuit configuration as that of the data reading circuit 30A, includes PMOS transistors 41A, 43A, a non-volatile memory element 42A, an NMOS transistor 44A, and a latch circuit composed of inverter circuits 45A, 46A. The initial state of the non-volatile memory element 42A is an enhancement state in which no data has been written. The PMOS transistors 41A, 43A and the non-volatile memory element 42A are adapted to be written more easily than the PMOS transistors 31A, 33A and the non-volatile memory element 32A. For example, the W/L ratios of the PMOS transistors 41A, 43A and the non-volatile memory element 42A are set to be larger than the W/L ratios of the PMOS transistors 31A, 33A and the non-volatile memory element 32A.

The state detection circuit 50A includes PMOS transistors 51A, 53A, 58A, 59A, a non-volatile memory element 52A, inverter circuits 55A, 56A, 57A, and an NMOS transistor 54A.

The elements of the data reading circuit 30A are connected as described below. The source of the PMOS transistor 31A is connected to a supply terminal VDD, the gate thereof is connected to a node N5, and the drain thereof is connected to the source of the non-volatile memory element 32A. The gate of the non-volatile memory element 32A is floating and the drain thereof is connected to the source of the PMOS transistor 33A. The gate of the PMOS transistor 33A is connected to the node N5, and the drain thereof is connected to a node DOUTA. The source of the NMOS transistor 34A is connected to a supply terminal VSS, and the drain thereof is connected to the node DOUTA. The input terminal of the inverter circuit 35A is connected to an output terminal of the inverter circuit 36A, and the output terminal thereof is connected to the node DOUTA and the input terminal of the inverter circuit 36A. A signal Φ02 is input to the gate of the NMOS transistor 34A.

The elements of the data reading circuit 30B are connected as described below. The source of the PMOS transistor 31B is connected to the supply terminal VDD, the gate thereof is connected to the node N5, and the drain thereof is connected to the source of the non-volatile memory element 32B. The gate of the non-volatile memory element 32B is floating and the drain thereof is connected to the source of the PMOS transistor 33B. The gate of the PMOS transistor 33B is connected to the node N5, and the drain thereof is connected to a node DOUTB. The source of the NMOS transistor 34B is connected to the supply terminal VSS, and the drain thereof is connected to the node DOUTB. The input terminal of the inverter circuit 35B is connected to an output terminal of the inverter circuit 36B, and the output terminal thereof is connected to the node DOUTB and the input terminal of the inverter circuit 36B. The signal Φ02 is input to the gate of the NMOS transistor 34B.

The elements of the dummy reading circuit 40A are connected as described below. The source of the PMOS transistor 41A is connected to the supply terminal VDD, the gate thereof is connected to a node N3, and the drain thereof is connected to the source of the non-volatile memory element 42A. The gate of the non-volatile memory element 42A is connected to the gate of the non-volatile memory element 52A of the state detection circuit 50A, and the drain thereof is connected to the source of the PMOS transistor 43A. The gate of the PMOS transistor 43A is connected to the node N3 and the drain is connected to a node N4. The source of the NMOS transistor 44A is connected to the supply terminal VSS, and the drain thereof is connected to the node N4. The input terminal of the inverter circuit 45A is connected to the output terminal of the inverter circuit 46A, and the output terminal thereof is connected to the N4 and the input terminal of the inverter circuit 46A. The signal Φ02 is input to the gate of the NMOS transistor 44A.

The elements of the state detection circuit 50A are connected as described below. The source of the PMOS transistor 51A is connected to the supply terminal VDD, and the drain thereof is connected to the source of the non-volatile memory element 52A. The drain of the non-volatile memory element 52A is connected to the source of the PMOS transistor 53A. The drain of the PMOS transistor 53A is connected to a node N1. The source of the PMOS transistor 59A is connected to the node N1 and the drain thereof is connected to the supply terminal VSS. The input terminal of the inverter circuit 57A is connected to the node N1, and the output terminal thereof is connected to the gate of the PMOS transistor 58A. The source of the PMOS transistor 58A is connected to the supply terminal VDD, and the drain thereof is connected to a node N2. The input terminal of the inverter circuit 55A is connected to the output terminal of the inverter circuit 56A, and the output terminal thereof is connected to the node N2 and the input terminal of the inverter circuit 56A. The source of the NMOS transistor 54A is connected to the supply terminal VSS, and the drain thereof is connected to the node N2. A signal Φ03 is input to the gates of the PMOS transistor 51A and the PMOS transistor 53A. A signal Φ02X, which is an inverted signal of the signal Φ02, is input to the gate of the PMOS transistor 59A. The signal Φ02 is input to the gate of the NMOS transistor 54A.

A signal Φ01 is input to one input terminal of the OR circuit 61, the node N2 is connected to the other input terminal thereof, and the output terminal thereof is connected to a node N3. The signal Φ01 is input to one input terminal of the OR circuit 62, the node N4 is connected to the other input terminal thereof, and the output terminal thereof is connected to a node N5.

The operation of the data reading device according to the first embodiment configured as described above will be described on the basis of the timing charts given in FIG. 2 and FIG. 3.

Figure 2:
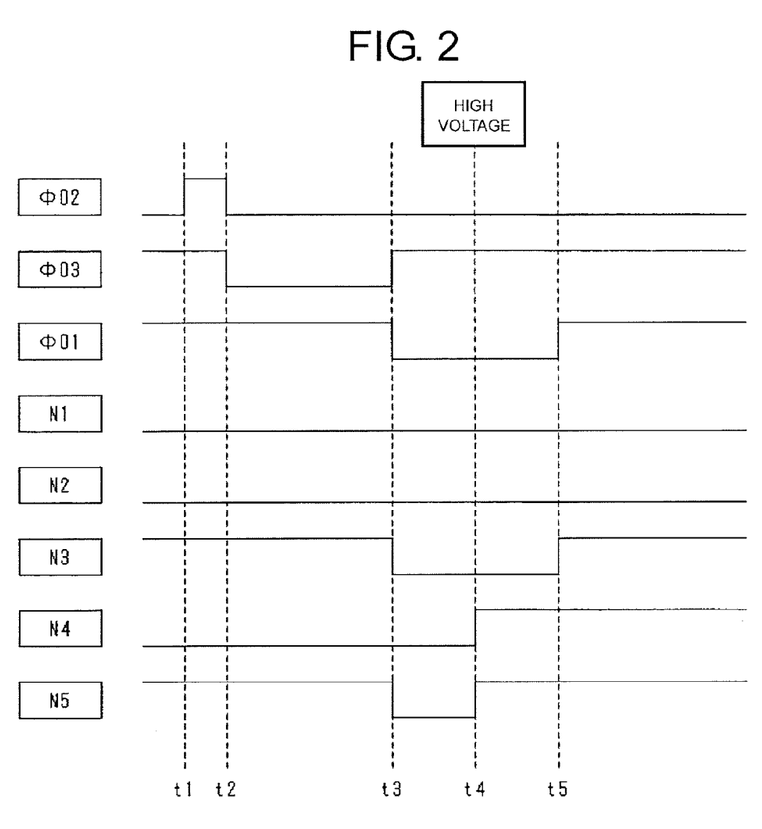
FIG. 2 is a timing chart illustrating an operation of the data reading device according to the first embodiment.

FIG. 2 illustrates an operation for preventing erroneous writing when the data reading device starts a reading operation and a high voltage is applied during the reading operation.

When the signal Φ02 goes to a high level at time t1, the NMOS transistors 34A, 34B, 44A, 54A turn on, and the nodes DOUTA, DOUTB, N2, N4 go to a low level. Then, the latch circuits latch the low level. At the same time, the signal Φ02X goes to the low level, so that the PMOS transistor 59A turns on and the node N1 goes to the low level, causing the PMOS transistor 58A to turn off. Further, the signals Φ01, Φ03 are at the high level, so that the PMOS transistors 31A, 33A, 31B, 33B, 41A, 43A, 51A, 53A are all off.

Subsequently, at time t2, the signal Φ02 goes to the low level, the signal Φ02X goes to the high level, and the signal Φ03 goes to the low level. The PMOS transistors 51A, 53A turn on, but no data has been written to the non-volatile memory element 42A, so that no charges have been injected into the floating gate and no current will flow into the non-volatile memory element 52A. Hence, the node N1 remains at the low level. The voltage of the node N1 is retained by a parasitic capacitance existing in the node N1. At this time, if a high voltage is applied to the supply terminal VDD, then the potential state around the non-volatile memory element 52A will become the same state as that at data writing. However, the node N1 is retained in a low level state merely by the capacitance, so that current required for writing cannot be supplied and erroneous writing will not occur.

At time t3, the signal Φ03 goes to the high level, and the signal Φ01 goes to the low level. Since the node N2 is held at the low level, the node N3, which is the output terminal of the OR circuit 61, goes to the low level. Similarly, since the node N4 is held at the low level, the node N5, which is the output terminal of the OR circuit 62, goes to the low level, causing the data reading unit 300 to carry out the reading operation.

A description will now be given of the operation of the data reading device when an unexpected high voltage is applied to the semiconductor device at time t4.

At this time, the potential around each of the non-volatile memory elements 32A, 32B, 42A is the same. However, the W/L ratios of the PMOS transistors 41A, 43A are designed to be larger than the W/L ratios of the PMOS transistors 31A, 33A, 31B, 33B, so that the voltage drop between the source and the drain of each of the PMOS transistors 41A, 43A will be less. Thus, the voltage applied between the source and the drain of the non-volatile memory element 42A will be higher than the voltage applied between the source and the drain of the non-volatile memory elements 32A, 32B. This makes it easier to write to the non-volatile memory element 42A. Further, the W/L ratio of the non-volatile memory element 42A is designed to be larger than the W/L ratios of the non-volatile memory elements 32A, 32B, so that a larger on-current will flow even if a write voltage remains the same, causing the node N4 to go to the high level sooner than the node DOUTA and the node DOUTB. In this case, writing to the non-volatile memory element 42A causes the node N4 to go to the high level and also the node N5, which is the output terminal of the OR circuit 62, to go to the high level. Thus, the data reading unit 300 stops the reading operation, preventing erroneous writing to the non-volatile memory elements 32A, 32B.

Erroneous writing to the non-volatile memory element 42A causes charges to be injected to the gate of the non-volatile memory element 42A and the non-volatile memory element 52A also passes current, but the node N1 remains at the low level, because the PMOS transistors 51A, 53A are off.

When the signal Φ01 goes to the high level at time t5, the node N3 goes to the high level, terminating the reading operation.

Figure 3:
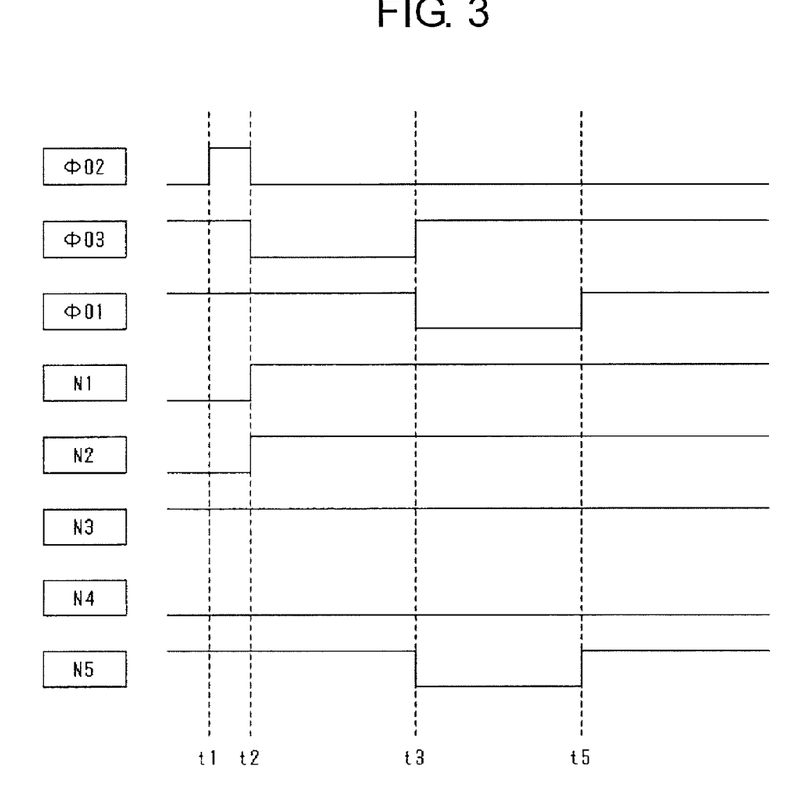
FIG. 3 is another timing chart illustrating the operation of the data reading device according to the first embodiment.

FIG. 3 is a timing chart illustrating the reading operation of the data reading device after erroneous writing to the non-volatile memory element 42A of the dummy reading circuit 40A takes place.

When the signal Φ02 goes to the high level at time t1, the NMOS transistors 34A, 34B, 44A, 54A turn on, and the nodes DOUTA, DOUTB, N2, N4 go to the low level. Further, the latch circuits latch the low level. At the same time, the signal Φ02X goes to the low level, so that the PMOS transistor 59A turns on, causing the node N1 to go to the low level and the PMOS transistor 58A to turn off. Further, the signals Φ01, Φ03 are at the high level, so that PMOS transistors 31A, 33A, 31B, 33B, 41A, 43A, 51A, 53A are all off.

Then, at time t2, the signal Φ02 goes to the low level, the signal Φ02X goes to the high level, and the signal Φ03 goes to the low level. When the PMOS transistors 51A, 53A turn on, current flows to the non-volatile memory element 52A, because the non-volatile memory element 42A has been written and the charges have been injected into the floating gate. Hence, the node N1 goes to the high level, so that the PMOS transistor 58A turns on and the latch is inverted, causing the node N2 to go to the high level.

At time t3, the signal Φ03 goes to the high level and the signal Φ01 goes to the low level. Since the node N2 is being retained at the high level, the node N3, which is the output terminal of the OR circuit 61, goes to the high level. Since the PMOS transistors 41A, 43A are off, the node N4 is retained at the low level, so that the node N5, which is the output terminal of the OR circuit 62, goes to the low level and the data reading unit 300 carries out the reading operation.

When the signal Φ01 goes to the high level at time t5, the node N5 goes to the high level, terminating the reading operation.

As described above, erroneous writing to the non-volatile memory elements can be prevented even if a high voltage is applied during the data reading operation. For a stable operation, a capacitance element may be connected to the node N1. The capacitance element in this case has to be set to a capacitance value that does not allow the passage of current required for erroneous writing as described above. Further, the description has been given of the case where, in the dummy reading circuit 40A, the W/L ratios of the PMOS transistors 41A, 43A and the non-volatile memory element 42A are set to be larger than the W/L ratios of the PMOS transistors 31A, 33A, 31B, 33B and the non-volatile memory elements 32A, 32B such that writing occurs more easily than in the data reading circuits 30A, 30B; alternatively, however, any one of the W/L ratios may be larger or a combination thereof may be used. Whether erroneous writing to the non-volatile memory element 42A has occurred can be checked by checking whether the node N2 is at the high level or the low level in the period from time t2 to time t3. More specifically, if the node N2 is at the high level, then it indicates that erroneous writing has occurred earlier, and if the node N2 is at the low level, then it means that no writing has occurred. The number of the data reading circuits included in the data reading unit may be any number from one.

Second Embodiment

Figure 4:
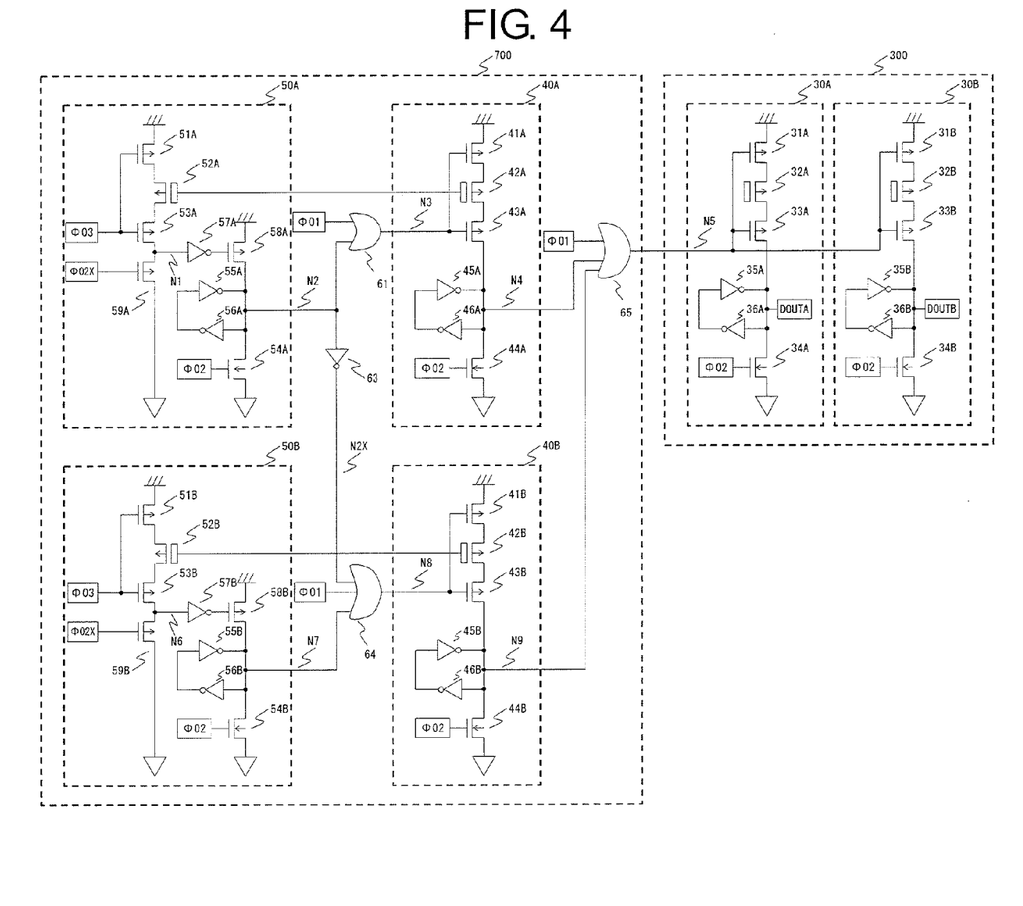
FIG. 4 is a circuit diagram of a data reading device according to a second embodiment.

FIG. 4 is a circuit diagram illustrating a data reading device according to a second embodiment. The data reading device is composed of a data reading unit 300 and an erroneous writing prevention circuit 700. The data reading unit 300 is the same as that in the first embodiment, so that the description of the circuit configuration will be omitted. The erroneous writing prevention circuit 700 is composed of dummy reading circuits 40A, 40B, state detection circuits 50A, 50B, OR circuits 61, 64, 65, and an inverter circuit 63. The dummy reading circuit 40A and the state detection circuit 50A are the same as those in the first embodiment, so that the description of the circuit configurations will be omitted. The dummy reading circuit 40B has the same circuit configuration as that of the dummy reading circuit 40A and includes PMOS transistors 41B, 43B, a non-volatile memory element 42B, an NMOS transistor 44B, and inverters 45B, 46B. However, the PMOS transistors 41B, 43B and the non-volatile memory element 42B are adapted to be as easy to be written as the PMOS transistors 41A, 43A and the non-volatile memory element 42A. The state detection circuit 50B has the same circuit configuration as that of the state detection circuit 50A and includes PMOS transistors 51B, 53B, 58B, 59B, a non-volatile memory element 52B, inverter circuits 55B, 56B, 57B, and an NMOS transistor 54B.

The connections of data reading circuits 30A, 30B, the dummy reading circuit 40A, and the state detection circuit 50A are the same as those in the first embodiment, so that the description of the circuit connections will be omitted.

The source of the PMOS transistor 41B is connected to a supply terminal VDD, the gate thereof is connected to a node N8, and the drain thereof is connected to the source of the non-volatile memory element 42B. The gate of the non-volatile memory element 42B is connected to the gate of the non-volatile memory element 52B, and the drain thereof is connected to the source of the PMOS transistor 43B. The gate of the PMOS transistor 43B is connected to the node N8, and the drain thereof is connected to a node N9. The source of the NMOS transistor 44B is connected to a supply terminal VSS, and the drain thereof is connected to the N9. The input terminal of the inverter circuit 45B is connected to the output terminal of the inverter circuit 46B, and the output terminal thereof is connected to the N9 and the input terminal of the inverter circuit 46B.

The source of the PMOS transistor 51B is connected to the supply terminal VDD, and the drain thereof is connected to the source of the non-volatile memory element 52B. The drain of the non-volatile memory element 52B is connected to the source of the PMOS transistor 53B. The drain of the PMOS transistor 53B is connected to a node N6. The source of the PMOS transistor 59B is connected the node N6, and the drain thereof is connected to the supply terminal VSS. The input terminal of the inverter circuit 57B is connected to the node N6, and the output terminal thereof is connected to the gate of the PMOS transistor 58B. The source of the PMOS transistor 58B is connected to the supply terminal VDD, and the drain thereof is connected to a node N7. The input terminal of the inverter circuit 55B is connected to the output terminal of the inverter circuit 56B, and the output terminal thereof is connected to the node N7 and the input terminal of the inverter circuit 56B. The source of the NMOS transistor 54B is connected to the supply terminal VSS, and the drain thereof is connected to the node N7. A signal Φ01 is input to one input terminal of the OR circuit 61, a node N2 is connected to the other input terminal thereof, and the output terminal thereof is connected to a node N3. A node N4 and a node N9 are connected to two input terminals of the OR circuit 65, a signal Φ01 is input to the remaining input terminal thereof, and the output terminal thereof is connected to a node N5. The inverter circuit 63 has a node N2 connected to the input terminal thereof, and a node N2X connected to the output terminal thereof. The node N2X and the node N7 are connected to two input terminals of the OR circuit 64, the signal Φ01 is input to the remaining input terminal thereof, and a node N8 is connected to the output terminal thereof.

The operation of the data reading device according to the second embodiment configured as described above will be described with reference to the timing chart given in FIG. 5.

Figure 5:
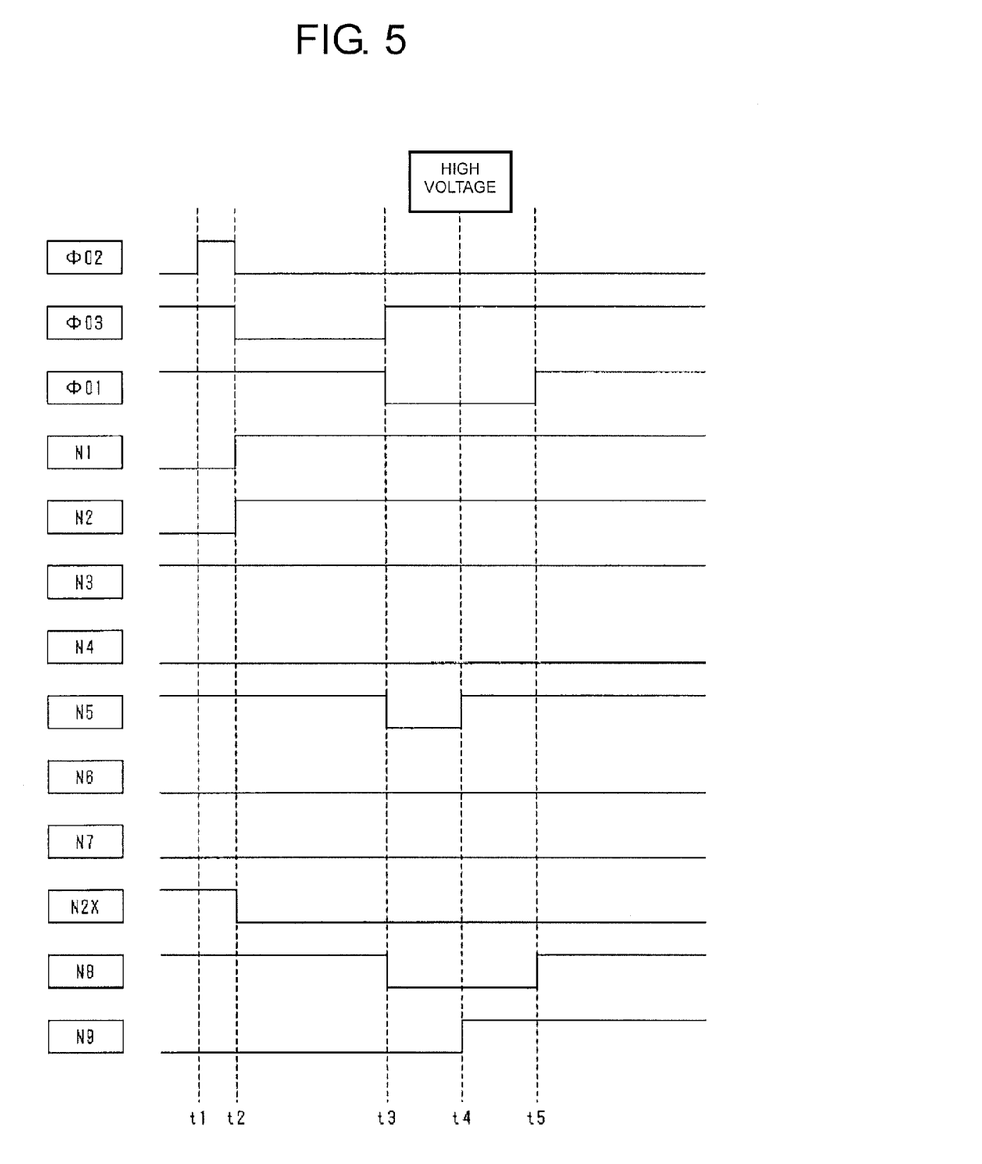
FIG. 5 is a timing chart illustrating an operation of the data reading device according to the second embodiment.

FIG. 5 illustrates the operation for preventing erroneous writing when, after the non-volatile memory element 42A is erroneously written, the data reading device starts a reading operation and a high voltage is applied during the reading operation.

A signal Φ02 goes to a high level at time t1, NMOS transistors 34A, 34B, 44A, 44B, 54A, 54B turn on, and nodes DOUTA, DOUTB, N2, N4, N7, N9 go to a low level. At the same time, Φ02X, which is an inverted signal of the signal Φ02, goes to a low level, so that PMOS transistors 59A, 59B turns on and the node N1 and the node N6 go to the low level, causing PMOS transistors 58A, 58B to turn off. Further, signals Φ01, Φ03 are at the high level, so that PMOS transistors 31A, 33A, 31B, 33B, 41A, 43A, 41B, 43B, 51A, 53A, 51B, 53B are all off.

Then, at time t2, the signal Φ02 goes to the low level, the signal Φ02X goes to the high level, and the signal Φ03 goes to the low level. Since the non-volatile memory element 42A has been erroneously written, charges have been injected into a floating gate and current flows to a non-volatile memory element 52A. This causes the node N1 to go to the high level, so that the PMOS transistor 58A turns on and the node N2 goes to the high level. Since the non-volatile memory element 42B has not been erroneously written, no charges have been injected into the floating gate, so that no current will flow to the non-volatile memory element 52B. Thus, the node N6 remains at the low level.

At time t3, the signal Φ03 goes to the high level, and the signal Φ01 goes to the low level. The node N2 is being retained at the high level, so that the node N3, which is the output terminal of the OR circuit 61, goes to the high level. Since the PMOS transistors 41A, 43A are off, the node N4 is retained at the low level. Meanwhile, the node N2X is at the low level and the node N7 is also being retained at the low level, so that a node N8, which is the output terminal of the OR circuit 64, goes to the low level. Although the node N8 goes to the low level and the PMOS transistors 41B, 43B turn on, the node N9 remains at the low level, because the non-volatile memory element 42B has not been written. Therefore, the node N5, which is the output terminal of the OR circuit 65, goes to the low level, and the data reading unit 300 carries out the reading operation.

A description will be given of the operation of the data reading device when an unexpected high voltage is applied to a semiconductor device at time t4.

At this time, the potential around each of the non-volatile memory elements 32A, 32B, 42B is the same. However, the W/L ratios of the PMOS transistors 41B, 43B are designed to be larger than the W/L ratios of the PMOS transistors 31A, 33A, 31B, 33B, so that a voltage drop between the source and the drain of each of the PMOS transistors 41B, 43B will be less. Thus, the voltage applied between the source and the drain of the non-volatile memory element 42B will be higher than the voltage applied between the source and the drain of the non-volatile memory elements 32A, 32B. This makes it easier to write to the non-volatile memory element 42B. Further, the W/L ratio of the non-volatile memory element 42B is designed to be larger than the W/L ratios of the non-volatile memory elements 32A, 32B, so that a larger on-current will be passed even if a write voltage remains the same, causing the node N9 to go to the high level sooner than the node DOUTA and the node DOUTB. In this case, writing to the non-volatile memory element 42B causes the node N9 to go to the high level and also the node N5, which is the output terminal of the OR circuit 65, to go to the high level. Thus, the data reading unit 300 stops the reading operation, preventing erroneous writing to the non-volatile memory elements 32A, 32B. Writing to the non-volatile memory element 42B causes charges to be injected into the gate of the non-volatile memory element 42B and the non-volatile memory element 52B also passes current, but the node N6 remains at the low level, because the PMOS transistors 51B, 53B are off.

When the signal Φ01 goes to the high level at time t5, the node N5 goes to the high level, and the reading operation is terminated.

In the present embodiment, the description has been given of the case where two each of the dummy reading circuits and the state detection circuits are disposed; however, any number of the dummy reading circuits and the state detection circuits may be disposed to permit the prevention of any number of times of erroneous writing. A dummy reading circuit that has been written can be identified by checking whether the node N2 and the node N7 are at the high level or the low level during the period from time t2 to time t3.

The circuit configurations of the data reading devices in the first and the second embodiments in accordance with the present invention described above are to be considered illustrative, and may be modified to an extent that does not depart from the scope of the appended claim.

Figure 6:
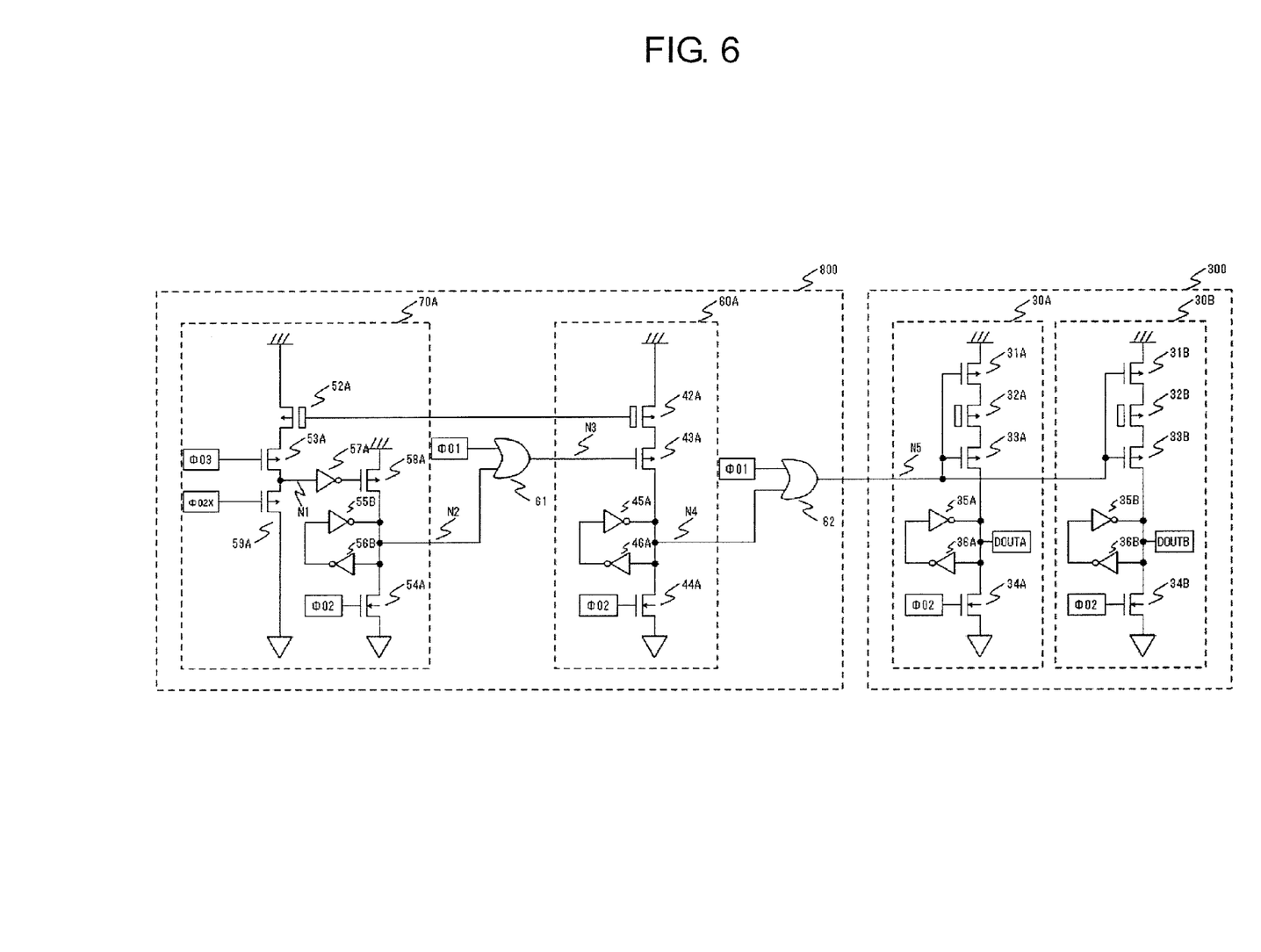
FIG. 6 is a circuit diagram illustrating another example of the data reading device.

For example, as illustrated in the circuit diagram of the data reading device in FIG. 6, the sources of non-volatile memory elements 42A and 52A may be directly connected to supply terminals VDD in a dummy reading circuit 60A and a state detection circuit 70A of an erroneous writing prevention circuit 800. This configuration further increases the voltage applied between the source and the drain of the non-volatile memory element 42A, thus providing an advantage that the writing thereto is easier.

Further alternatively, the OR circuits may be composed of NAND circuits by inverting an input logic.

What is claimed is:

1. A data reading device comprising:
a data reading unit provided with an arbitrary quantity of data reading circuits which include non-volatile memory elements;
a dummy reading circuit including a non-volatile memory element configured to be written more easily than the non-volatile memory elements of the data reading circuits, wherein the dummy reading circuit is set such that a higher voltage is applied to both ends of the non-volatile memory element in the dummy reading circuit than in the data reading circuits; and
a state detection circuit that detects a written state of the non-volatile memory element of the dummy reading circuit,
wherein, in the case where the state detection circuit detects the written state of the non-volatile memory element of the dummy reading circuit during an operation of reading data from the non-volatile memory elements of the data reading circuits, the operation of reading the data from the non-volatile memory elements of the data reading circuits is stopped so as to prevent erroneous writing to the non-volatile memory elements of the data reading circuits.

2. The data reading device according to claim 1, wherein the state detection circuit connects the gates of the non-volatile memory elements of the dummy reading circuits and the gate of a non-volatile memory element of the state detection circuit thereby to detect the written states of the non-volatile memory elements of the data reading circuits.

3. The data reading device according to claim 1, wherein the state detection circuit connects the gates of the non-volatile memory elements of the data reading circuits and the gate of a non-volatile memory element of the state detection circuit thereby to detect the written states of the non-volatile memory elements of the data reading circuits.

4. The data reading device according to claim 1, comprising arbitrary quantities of the dummy reading circuits and the state detection circuits.

5. A semiconductor device comprising the data reading device according to claim 1.

* * * * *